United States Patent [19]

Eguchi

[11] Patent Number: 5,528,227
[45] Date of Patent: Jun. 18, 1996

[54] SIGNAL PROCESSING APPARATUS GENERATING A SIGNAL HAVING A FEQUENCY CORRESPONDING TO THE SUM OF FREQUENCIES OF INPUT SIGNALS FOR DISPLACEMENT DETECTION

[75] Inventor: Tadashi Eguchi, Kawasaki, Japan

[73] Assignee: Canon Kabushiki Kaisha, Tokyo, Japan

[21] Appl. No.: 100,217

[22] Filed: Aug. 2, 1993

[30] Foreign Application Priority Data

Aug. 6, 1992 [JP] Japan ................................. 4-231291
Jul. 15, 1993 [JP] Japan ................................. 5-197981

[51] Int. Cl.⁶ ............................ G08B 21/00; G01B 11/02
[52] U.S. Cl. ............................................. 340/671; 356/356
[58] Field of Search .................................. 340/670, 671; 356/345, 353–358, 363; 327/113, 117, 119–122

[56] References Cited

U.S. PATENT DOCUMENTS 4,676,645  6/1987  Taniguchi et al. ...................... 356/356
5,067,089  11/1991  Ishii et al. ................................ 364/486
5,235,406  8/1993  Ishii et al. ................................ 356/356
5,347,355  9/1994  Eguchi ...................................... 356/356

FOREIGN PATENT DOCUMENTS 0298183  1/1989  European Pat. Off. ......... G01B 11/00
0463561  1/1992  European Pat. Off. ......... G01D 5/38
3106429A1  9/1982  Germany ........................ G01D 5/245
368812  3/1991  Japan ............................. G01D 5/245

Primary Examiner—Safet Metjahic
Assistant Examiner—John W. Miller
Attorney, Agent, or Firm—Fitzpatrick, Cella, Harper & Scinto

[57] ABSTRACT

A signal processing method includes the steps of inputting first to N-th 2-phase sinusoidal wave signals, where N is a natural number ($N \geq 2$) and an m-th 2-phase sinusoidal wave signal has an m-th frequency where m is a natural number and satisfies a relation of $1 \leq m \leq N$, and processing the first to N-th 2-phase sinusoidal signals by product summation or product differentiation of the first to N-th 2-phase sinusoidal wave signals to produce at least one signal having a frequency equal to a sum of the frequencies of the first to N-th 2-phase sinusoidal wave signals.

13 Claims, 6 Drawing Sheets

SIGNAL PROCESSING APPARATUS GENERATING A SIGNAL HAVING A FEQUENCY CORRESPONDING TO THE SUM OF FREQUENCIES OF INPUT SIGNALS FOR DISPLACEMENT DETECTION

BACKGROUND OF THE INVENTION

1. Field of the Invention

The present invention relates to a signal processing method and a displacement detection apparatus which uses the same, and more particularly to a displacement detection apparatus such as a rotary encoder or a linear encoder which detects displacement information of a moving object from a displacement signal relating to the moving object obtained from detection means.

2. Related Background Art

In a prior art rotary encoder or linear encoder or the like, two sinusoidal waves of different phases (2-phase sinusoidal wave signals or namely, a sine wave and a cosine wave) relating to displacement information are generated by detection means, and a displacement and a direction of movement (direction of displacement) are detected based on the two sinusoidal wave signals.

In a prior art encoder, a plurality of divisional pulses having a phase difference corresponding to a division unit are made from the sine wave signal and the cosine wave signal to enhance a detection resolution of the displacement information relating to the moving object.

FIG. 1 shows a block diagram of a main portion for illustrating a signal processing method for the two sinusoidal wave signals in the prior art encoder. Signal waveforms in the circuit of FIG. 1 are shown by solid lines in FIG. 2.

In FIG. 1, numerals 51 and 52 denote input terminals to which a sine wave signal Cl(a) and a cosine wave signal S1(b) are respectively inputted. Namely, a signal b (cosine wave) having a 90 degrees phase difference to a signal a (sine wave) applied to the input terminal 51 is inputted from the input terminal 52. An inverting circuit 53 gets a signal c which has a 180 degrees phase difference to the signal a. Those three signals are appropriately weight-summed through resistors to insert a sinusoidal wave signal of a desired angle.

In FIG. 1, all resistors R are of equal value to get signals d and e having phase differences of 45 degrees and 135 degrees, respectively. Those signals are converted to square waves by comparators 54, 55, 56 and 57 to produce 2-phase square wave signals having a 90 degrees phase difference by a pulse circuit 58. In this manner, a signal of a higher resolution is produced from the sine wave signal and the cosine wave signal obtained from photo-sensing means.

Japanese Patent Application Laid-Open No. 3-68812 discloses an insertion method of a position measurement signal which attains a high resolution by outputting to insert data in a memory by using an A/D-converted version of 2-phase sinusoidal wave signals as an address.

In a prior art displacement detection apparatus such as an encoder or a laser interferometer, any desired resolution can be attained by weighted resistors.

However, the following problems arises when the resolution is to be enhanced.

(a) A precision of the summing resistors is required and a proper value may not be sometimes attained within a normal range.

(b) An insertion precision is lowered by an error of the summing resistors, an input offset of a comparator and an influence by a variation of a propagation delay time. A broken line in FIG. 2 shows a signal timing when the signal C1 includes an offset component. In the past, the offset component is adjusted by a potentiometer or the like in an electric circuit.

(c) The number of comparators increases whereby a circuit scale is large. For example, when 2-phase square wave signals having a frequency which is 64 times as high as that of the original signal is to be got, 32 comparators must be required.

SUMMARY OF THE INVENTION

It is an object of the present invention to provide a signal processing method and a displacement detection apparatus suitable for an encoder and a laser interferometer or the like which can detect movement information of a moving object at a high resolution.

Other objects of the present invention will be apparent from the following description of the preferred embodiments.

DETAILED DESCRIPTION OF THE PREFERRED EMBODIMENTS

Figure 1:
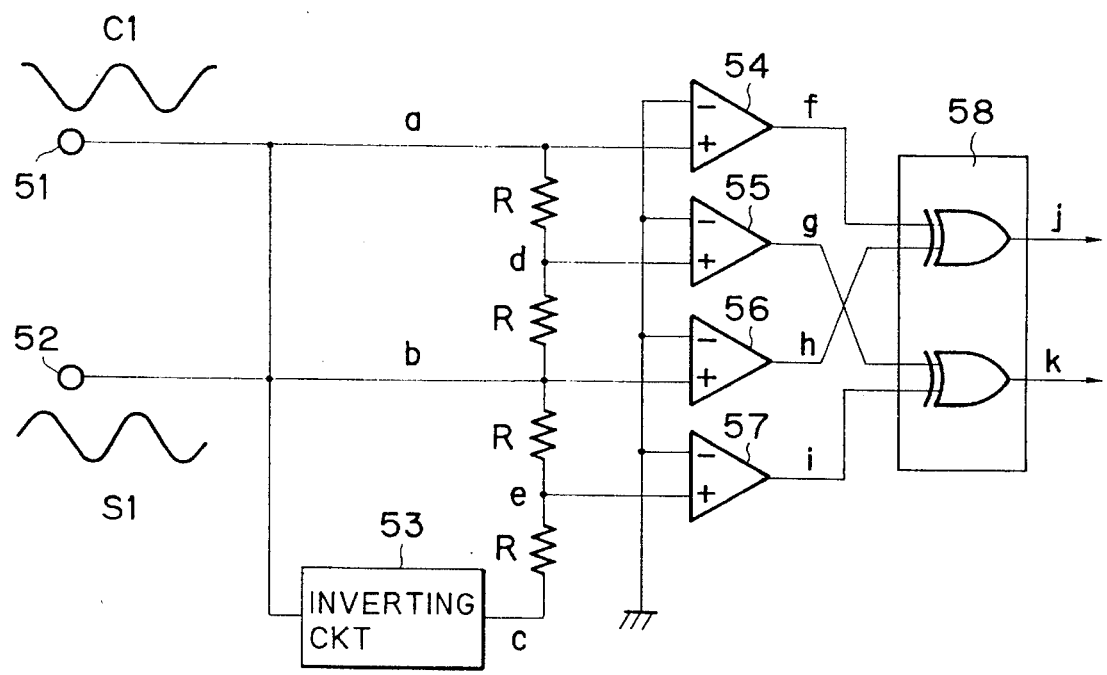
FIG. 1 shows a prior art method for processing a signal of an encoder.
Figure 2:
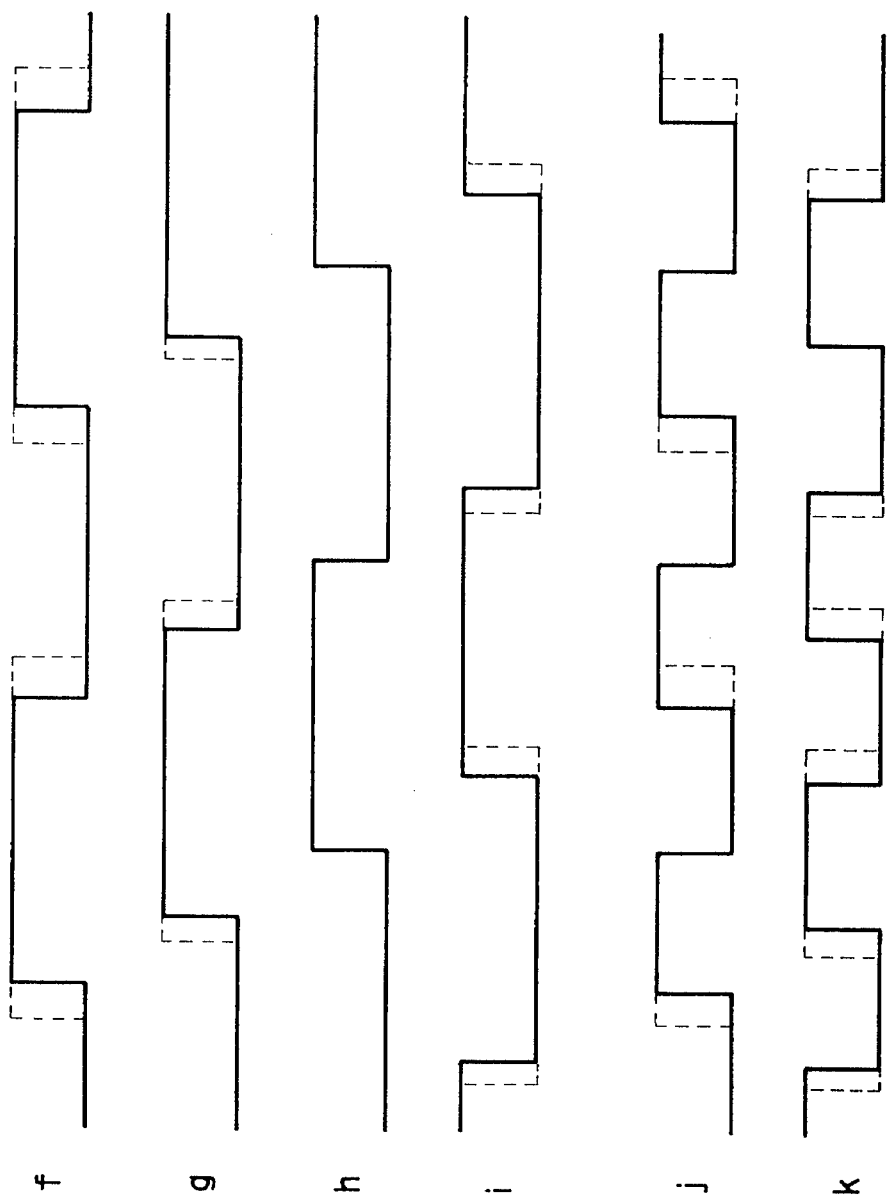
FIG. 2 shows signal waveforms of each part in the circuit of FIG. 1.
Figure 3:
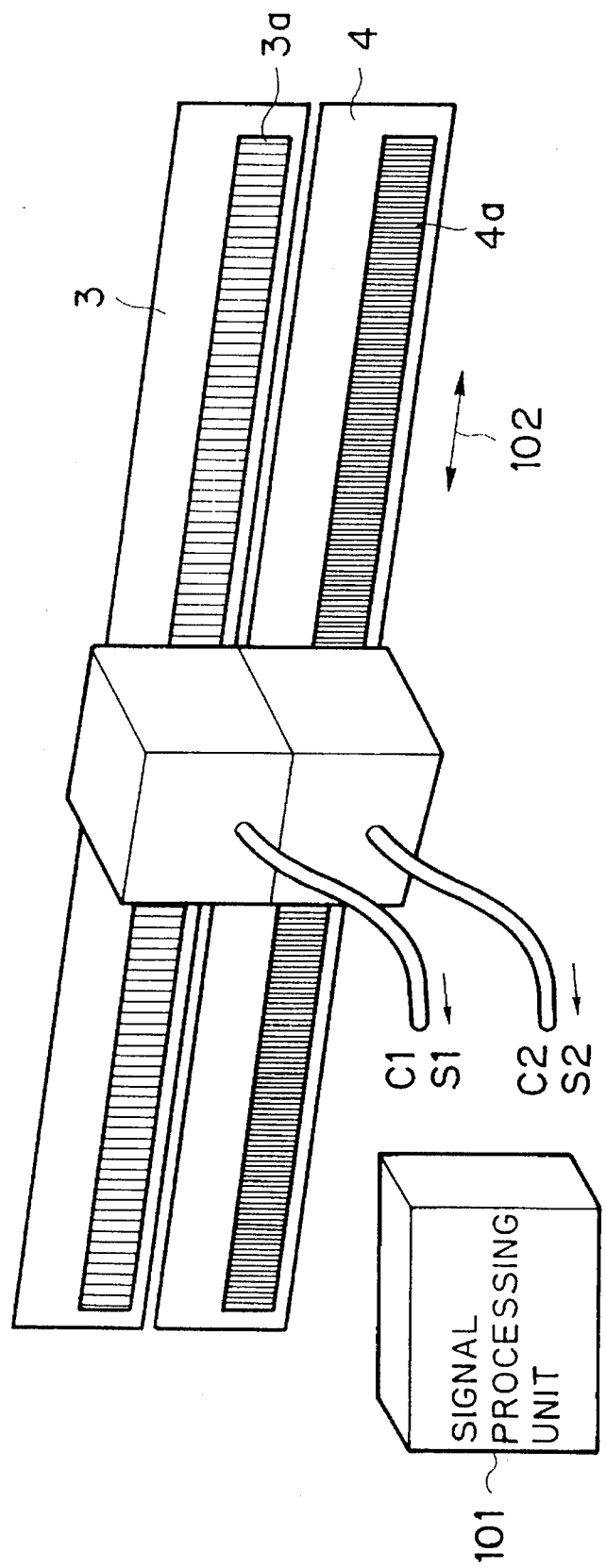
FIG. 3 shows main portions of an embodiment 1 when a displacement detection apparatus of the present invention is applied to a linear encoder.
Figure 4:
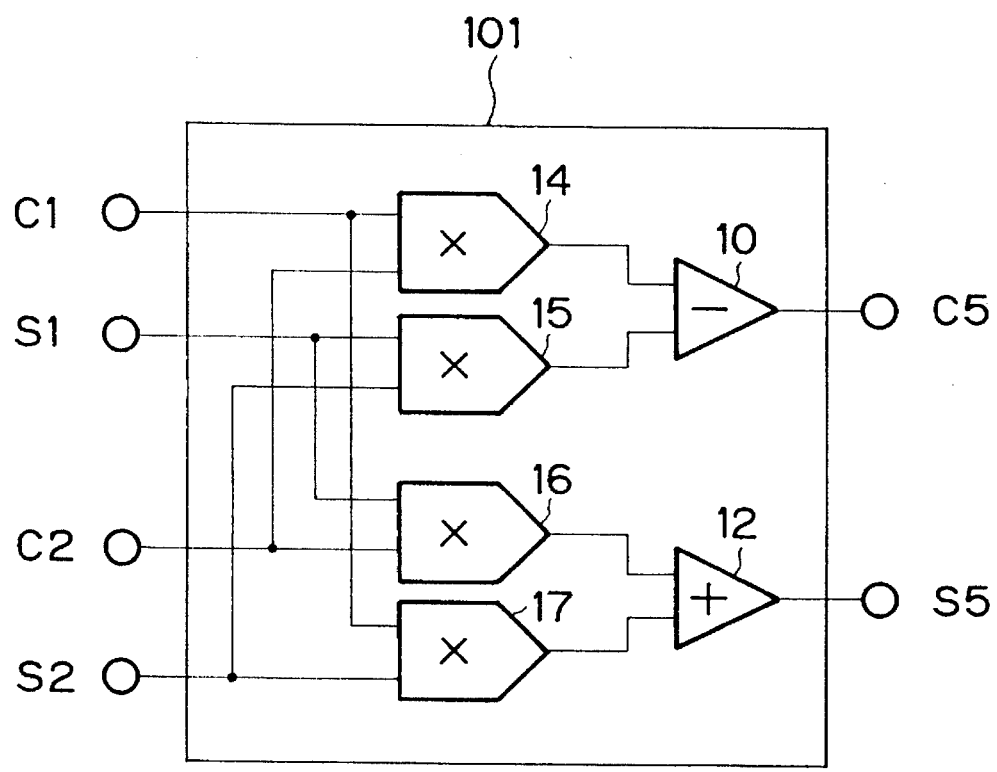
FIG. 4 shows a block diagram of a signal processing circuit of a signal processing unit of FIG. 3.

FIG. 3 shows main portions of an embodiment 1 when a linear encoder is used as the displacement detection apparatus of the present invention, and FIG. 4 shows a block diagram of a circuit of a signal processing unit 101 for illustrating a processing method of output signals from detection means (detection heads) 1 and 2 of FIG. 3.

In FIG. 3, numerals 3 and 4 denote scale plates which are mounted on a moving object (not shown) which is moved in a direction directed by an arrow 102. Scales 3a and 4a of different pitches from each other are formed on the scale plates 3 and 4 along the direction of movement. Numerals 1 and 2 denote detection means each including light projection means for projecting a light onto the scale plate 3 or 4 and photo-sensing means for detecting a reflected light beam from the scale plate 3 or 4. Each of the detection means 1 and 2 outputs two 2-phase sinusoidal wave signals (C1, S1, C2, S2) mutually having a 90 degrees phase difference based on movement information of the scale plate 3 or 4. Numeral 101 denotes a signal processing unit which detects the movement information such as the displacement of the moving object and the direction of movement and the like based on the output signals (C1, S1, C2, S2) from the detection means 1 and 2. A method for generating the 2-phase sinusoidal wave signals by optically reading the scales and a constitution of detection means therefor are well known and they are not explained here.

The 2-phase sinusoidal wave signals C1 and S1 derived from the detection means 1 are expressed as follows:

$$C1 = A \cos \omega_1 t \quad S1 = A \sin \omega_1 t \tag{1}$$

where $\omega_1$ is an angular frequency of the sinusoidal wave signal from the detection means 1, and $\omega_1/2\pi$ is a frequency of the sinusoidal wave signal. The frequency is proportional to a velocity of the moving object. A is a constant value.

On the other hand, the 2-phase sinusoidal wave signals C2 and S2 derived from the detection means 2 are expressed as follows:

$$C2 = B \cos \omega_2 t \quad S2 = B \sin \omega_2 t \tag{2}$$

where $\omega_2$ is an angular frequency of the sinusoidal wave signal from the detection means 2 and $\omega_2/2\pi$ is a frequency of the sinusoidal wave signal. This frequency is also proportional to the movement velocity of the moving object. B is a constant value.

The signal processing unit 101 produces signals C5 and S5 by the following operations by using the signals C1 and S1 got by the detection means 1 and the signals C2 and S2 got by the detection means 2 as shown in FIG. 4.

$$C5 = C1 \times C2 - S1 \times S2 = A B \cos(\omega_1 + \omega_2)t$$

$$S5 = S1 \times C2 - C1 \times S2 = A B \sin(\omega_1 + \omega_2)t \tag{3}$$

Namely, multiplication (C1×C2) of the signals C1 and C2 is effected by a multiplier circuit 14, multiplication (S1×S2) is effected by a multiplier circuit 15, and a difference (C1×C2−S1×S2) is calculated by a subtraction circuit 10 based on those products. The difference is outputted as a signal C5.

Similarly, multiplication (S1×C2) of the signals S1 and C2 is effected by a multiplication circuit 16, multiplication (C1×S2) of the signals C1 and S2 is effected by a multiplication circuit 17, and a sum (S1×C2+C1×S2) is calculated by an adder 12 based on those products. The sum is outputted as a signal S5. The frequencies of the signals C5 and S5 are $(\omega_1+\omega_2)/2\pi$ which is a sum of the frequencies of the original signals C1 and C2. This frequency is also proportional to the velocity of the object. In general, in such a displacement detection apparatus, the detection resolution is proportional to a reciprocal of the frequency generated at a predetermined velocity. In the present embodiment, the signals C5 and S5 having a resolution equal to a reciprocal corresponding to a sum of reciprocals of resolutions of the detection means 1 and 2 by the operation by the signal processing unit 101. Thus, the resolution can be further reduced and a smaller displacement can be detected. As a result, the movement information of the moving object can be detected with a high resolution.

Figure 5:
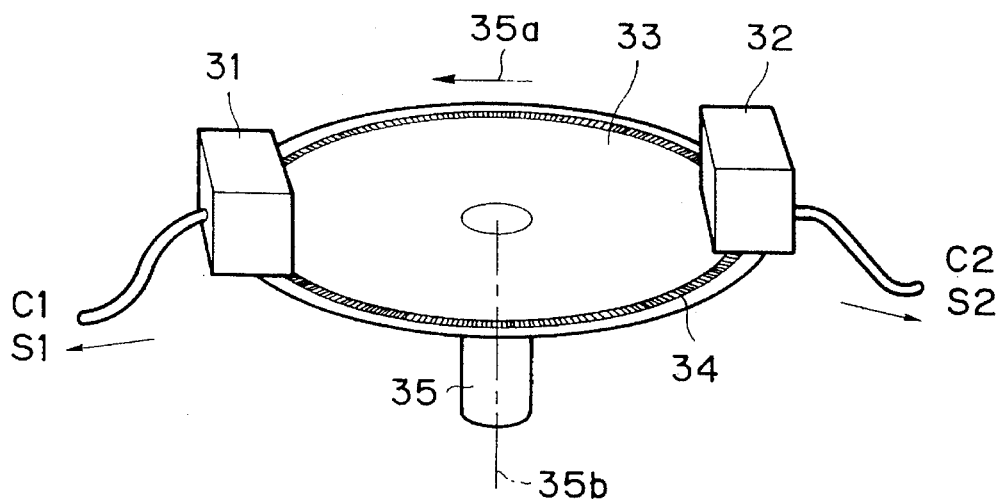
FIG. 5 shows main portions of an embodiment 2 when the displacement detection apparatus of the present invention is applied to a rotary encoder.

FIG. 5 shows main portions of an embodiment 2 when a rotary encoder is used as the displacement detection apparatus of the present invention.

In FIG. 5, numeral 33 denotes a disk-shaped rotary disk which is pivoted to a rotation shaft 35 of a rotating object (not shown) and it is rotated with the rotating object in a direction of an arrow 35a. A radial scale 34 having light reflection portions and light absorption portions (light transmission portions) radially arranged at a constant pitch on the surface of the rotary disk 33 around the center 35b of the rotation shaft 35.

Numerals 31 and 32 denote detection means (detection heads) which have light projection means for projecting a light beam onto the rotary disk 33 and photo-sensing means for detecting a reflected light beam from the rotary disk 33. The detection means 31 and 32 output 2-phase sinusoidal wave signals (C1, S1) and (C2, S2), respectively, each mutually having a 90 degrees phase difference on a basis of the rotation information of the rotating object.

In the present embodiment, the detection means 31 and 32 are arranged at positions rotationally-symmetric to the center (rotation center) 35b of the rotation shaft 35 and simultaneously detect light beams on a basis of the rotation information from two points on the radiation scale 34. In this manner, a detection error of the rotation information caused by more or less deviation of the center of the radiation scale 34 from the rotation center 35b, that is, by the eccentricity is corrected.

In the present embodiment, the 2-phase sinusoidal wave signals $$C1 = A\cos(\omega t + C \sin \theta)$$

$$S1 = A \sin(\omega t + C \sin \theta) \tag{4}$$

$$C2 = B \cos(\omega t - C \sin \theta)$$

$$S2 = B \sin(\omega t - C \sin \theta) \tag{5}$$

where $C \sin \theta$ is a component of a phase shift due to the eccentricity and it is an error component of one period per one revolution of the rotary disk (rotating object) 33. The output signals C1, S1 (C2, S2) from the detection means 31 (32) are input ted to the signal processing unit (not shown) 101 as same as stated in the embodiment 1.

In the present embodiment, the signal processing unit processes (operates) the signals in the same manner as the embodiment 1 to obtain the signals C5 and S5 corresponding to the sums of the resolutions of the two detection means 31 and 32. Namely, the following signals are produced:

$$C5 = C1 \times C2 - S1 \times S2 = A B \cos 2 \omega t$$

$$S5 = S1 \times C2 + C1 \times S2 = A B \sin 2 \omega t \tag{6}$$

As a result, the resolution value is one half of that of the original signal, that is, the detection of the displacement at the twice resolution to that of the original signal can be attained.

In the present embodiment, the detection resolution is doubled and the eccentricity error between the rotation center of the rotating object and the center of the rotary disk 33 is corrected to detect the rotation information of the rotating object at a high precision.

Figure 6:
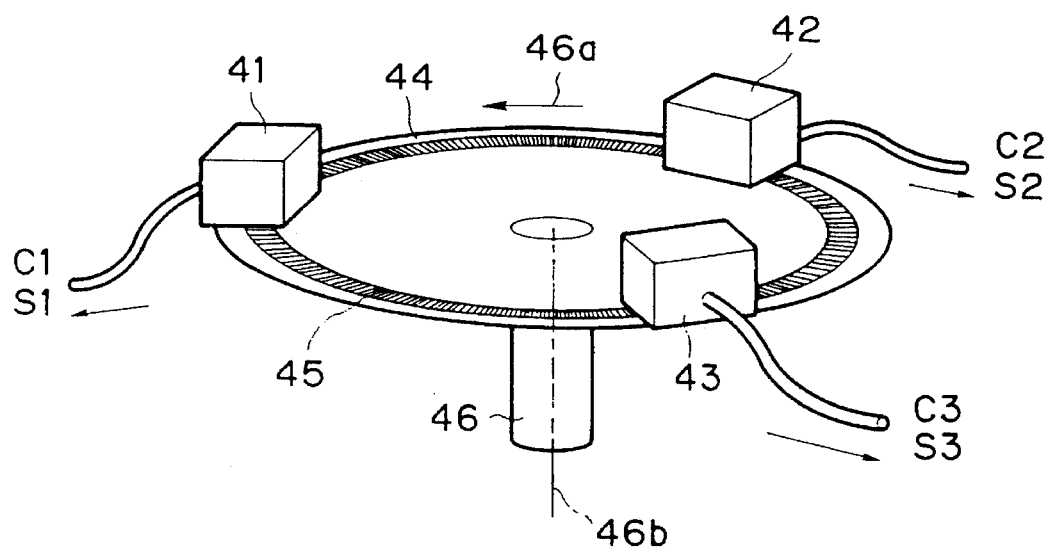
FIG. 6 shows main portions of an embodiment 3 when the displacement detection apparatus of the present invention is applied to a rotary engine.
Figure 7:
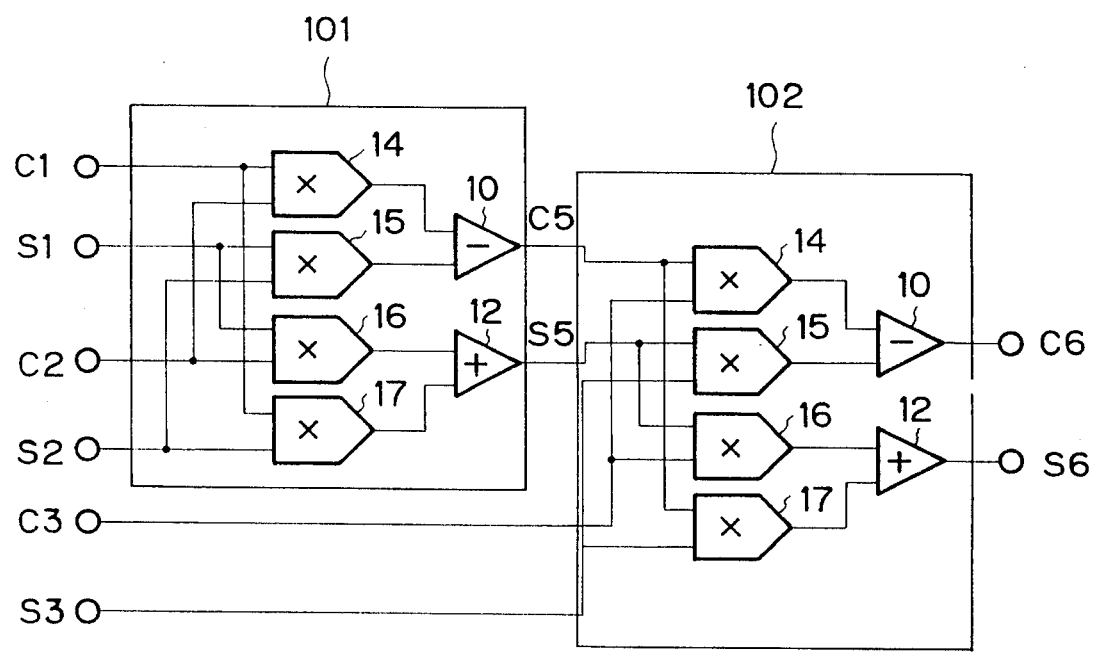
FIG. 7 shows a block diagram of a signal processing circuit of a signal processing unit of the embodiment 3 of the present invention.

FIG. 6 shows major portions of an embodiment 3 when a rotary encoder is used as the displacement detection apparatus of the present embodiment, and FIG. 7 shows a circuit diagram of a signal processing unit (not shown) for processing the output signals from the detection means 41, 42 and 43 of FIG. 6.

In the present embodiment, three detection means (detection heads) 41, 42 and 43 are circumferentially arranged at a constant pitch on a rotating disk 44.

In general, in a high resolution rotary encoder, a precision of writing of a radial scale of the rotating disk and a slight warp of the rotating disk directly affect an accumulated precision of the detection means. Since such an error component of the rotary encoder is considered as a variation in the frequency of the signal, the output signals from the detection means are expressed as follows:

$$C1 = A \cos \left\{ \omega_0 + \sum_{n=1}^{\infty} \omega_{sn}\sin(n\theta) + \sum_{n=1}^{\infty} \omega_{cn}\cos(n\theta) \right\} t \quad (7)$$

$$S1 = A \sin \left\{ \omega_0 + \sum_{n=1}^{\infty} \omega_{sn}\sin(n\theta) + \sum_{n=1}^{\infty} \omega_{cn}\cos(n\theta) \right\} t$$

where $\theta$ is a rotation angle of the rotating disk 44, and $\omega_0$ is a fundamental angular frequency outputted by the detection means by the rotation of the rotating disk 44. A second term and et seq. in the triangular function represent the error component.

As the present embodiment in which a plurality of detection means are arranged on a single rotating disk 44 at the constant pitch, the output signals from the respective detection means are expressed as follows. Namely, the 2-phase signals from the m-th detection means are expressed as follows:

$$C_m = A_m\cos \left\{ \omega_0 + \sum_{n=1}^{\infty} \omega_{sn}\sin(n\theta) + \sum_{n=1}^{\infty} \omega_{cn}\cos(n\theta) \right\} t \quad (8)$$

$$S_m = A_m\sin \left\{ \omega_0 + \sum_{n=1}^{\infty} \omega_{sn}\sin(n\theta) + \sum_{n=1}^{\infty} \omega_{cn}\cos(n\theta) \right\} t$$

As shown in FIG. 7, the output signals from the detection means 41 are C1 and S1, the output signals from the detection means 42 are C2 and S2, and the output signals from the detection means 43 are C3 and S3.

As shown in FIG. 7, the same operation as that of the embodiment 1 is conducted to the output signals from the detection means 41 and 42 by the signal processing unit 101 which is similar to that of the embodiment 1. The same operation is conducted to the resulting 2-phase output signals C5 and S5 and the 2-phase output signals C3 and S3 from the detection means 43 by the similar signal processing unit 102 to the signal processing unit 101 to obtain output signals C6 and S6 having a resolution equal to a reciprocal of a sum of reciprocals of the resolutions of the respective detection means.

In the present embodiment, the same operation as that of the embodiment 1 is conducted for the output signals from the plurality of (N) detection means to obtain signals $C_A$ and $S_A$ as shown by the following equations:

$$C_A = \cos \left\{ N\omega_0 + \sum_{n}^{\infty} \sum_{m=1}^{N} \omega_{sn}\sin \cdot n(\theta + 2\pi m/N) \right\} t \quad (9)$$

$$S_A = \sin \left\{ N\omega_0 + \sum_{n}^{\infty} \sum_{m=1}^{N} \omega_{sn}\sin \cdot n(\theta + 2\pi m/N) \right\} t$$

In this manner, the signal of the sum of the resolutions of the three detection means can be obtained. In order to facilitate the calculation, it is assumed that the amplitudes of the output signals from all detection means are 1 and a cosine component of the error component is not taken into consideration. Since the error component of the angular frequency in the above equations;

$$\sum_{n}^{\infty} \sum_{m=1}^{N} \omega_{sn}\sin\{n(\theta + 2\pi m/N)\}t \quad (9')$$

is a periodic function having discrete values, it is expressed as:

$$\sum_{m=1}^{N} \omega_{sn}\sin\{n(\theta + 2\pi m/N)\}t = \sum_{m=2}^{N+1} \omega_{sn}\sin\{n(\theta + 2\pi m/N)\}t \quad (10)$$

$$= \sum_{m=1}^{N} \omega_{sn}\sin\{n(\theta + 2\pi m/N + 2\pi/N)\}t$$

$$= \cos2\pi n/N \cdot \sum_{m=1}^{N} \omega_{sn}\sin\{n(\theta + 2\pi m/N)\}t +$$

$$\sin2\pi n/N \cdot \sum_{m=1}^{N} \omega_{sn}\cos\{n(\theta + 2\pi m/N)\}t$$

By solving the equation (10), we get:

$$(1 - \cos2\pi n/N) \sum_{m=1}^{N} \omega_{sn}\sin\{n(\theta + 2\pi m/N)\}t = \quad (11)$$

$$\sin2\pi n/N \cdot \sum_{m=1}^{N} \omega_{sn}\cos\{n(\theta + 2\pi m/N)\}t$$

In the equation (11), since $\theta$ may assume any value;

$$\sum_{m=1}^{N} \omega_{sn}\cos\{n(\theta + 2\pi m/N)\}t = \sum_{m=1}^{N} \omega_{sn}\sin\{n(\theta + 2\pi m/N)\}t = 0 \quad (12)$$

or $$1 - \cos2\pi n/N = \sin2\pi n/N = 0 \quad (13)$$

Namely, n=hN (where h is an integer). From the above operation, the error component other than the error component of the order equal to the integer multiple of the number of detection means is eliminated by arranging N detection means circumferentially at the constant pitch and the frequency of N times, that is, the resolution value of N can be attained.

Since most of the error component of the rotating disk of the detection means are usually primary and secondary components, the accumulated precision will be significantly high when the number of detection means is three or higher than the three.

The present invention may also be applied to a laser interferometer having a plurality of detection means for detecting the displacement information of the object by utilizing the interference of light waves, in addition to the encoder described above.

In accordance with the present invention, the signal processing method and the displacement detection apparatus using the same suitable for use in the encoder or the laser interferometer in which the movement signal obtained relating to the moving object is appropriately processed to especially get a plurality of sine wave signals and cosine wave signals which are appropriately processed to detect the movement information of the moving object at a higher resolution than those attained by the respective detection means are provided.

What is claimed is:

1. A signal processing apparatus comprising:

means for inputting first to N-th 2-phase sinusoidal wave signals mutually independently generated where N is a natural number and satisfies a relation of N≧2, m-th 2-phase sinusoidal wave signals being included in said first to N-th 2-phase sinusoidal wave signals having an m-th frequency where m is a natural number and satisfies a relation of 1≦m≦N; and means for processing the first to N-th 2-phase sinusoidal wave signals by product summation or product differentiation among the first to N-th 2-phase sinusoidal wave signals to produce at least one signal having a frequency equal to a sum of the frequencies of the first to N-th 2-phase sinusoidal wave signals.

2. A signal processing apparatus according to claim 1, wherein said signal processing means includes means for producing 2-phase sinusoidal wave signal having a frequency equal to a sum of the frequencies of the first to N-the 2-phase sinusoidal wave signals.

3. A signal processing apparatus according to claim 1, wherein N=2 and said signal processing means includes means for producing 2-phase sinusoidal wave signals having a frequency equal to a sum of the frequencies of the first to N-the 2-phase sinusoidal wave signals.

4. A signal processing apparatus according to claim 1, wherein N=3 and said signal processing means includes means for producing combined 2-phase sinusoidal wave signals having a frequency equal to a sum of the frequency of the first 2-phase sinusoidal wave signals and the frequency of the second 2-phase sinusoidal wave signals, and means for forming 2-phase sinusoidal wave signals having a frequency equal to the frequency of the combined 2-phase sinusoidal wave signal and the frequency of the third 2-phase sinusoidal wave signals.

5. A signal processing apparatus according to claim 1, wherein the first to N-th 2-phase sinusoidal wave signals are generated in association with the displacement of one object and the frequencies of the first to N-the 2-phase sinusoidal wave signals vary in proportion to a displacement velocity of the object.

6. A detection apparatus for detecting information relating to a displacement comprising:

a periodic signal generating unit for generating first to N-th 2-phase sinusoidal wave signals generated from mutually different detectors relating to the displacement of the object where N is a natural number and satisfies a relation of N=2, m-th 2-phase sinusoidal wave signals being included in said first to N-th 2-phase sinusoidal wave signals having an m-th frequency varying in proportion to a displacement velocity of the object where m is a natural number and satisfies a relation of $1 \leq m \leq N$; and a signal processing circuit for processing the first to N-the sinusoidal wave signals by product summation or product differentiation of the first to N-th 2-phase sinusoidal wave signals to produce at least one sum frequency signal having a frequency equal to a sum of the first to N-th frequencies for detecting the information relating to the displacement of the object.

7. A detection apparatus according to claim 6, wherein said signal processing circuit produces 2-phase sinusoidal wave signals having a frequency equal to a sum of the first to N-the frequencies.

8. A detection apparatus according to claim 6, wherein N=2 and said signal processing circuit produces 2-phase sinusoidal wave signals having a frequency equal to a sum of the first frequency and the second frequency.

9. A detection apparatus according to claim 6, wherein N=3 and said signal processing circuit includes a first circuit for producing combined 2-phase sinusoidal wave signals having a frequency equal to a sum of the first frequency and the second frequency and a second circuit for producing 2-phase sinusoidal wave signals having a frequency equal to a sum of the first to a third frequency based on the combined 2-phase sinusoidal wave signals and the third 2-phase sinusoidal wave signals.

10. A detection apparatus according to claim 6, wherein said periodic signal generation unit includes a plurality of detection means for optically reading one or plurality of scales provided on the object.

11. A detection apparatus according to claim 6, wherein said periodic signal generation unit includes a plurality of detection means for optically reading a radial grating provided on a rotating object to detect the rotation of the object as information relating to the displacement based on at least one sum frequency signal.

12. A detection apparatus for detecting information relating to a displacement comprising:

a periodic signal generation unit for generating first to N-th 2-phase sinusoidal wave signals generated from mutually different detectors relating to the displacement of an object where N is a natural number and satisfies a relation of N=2, m-th 2-phase sinusoidal wave signals being included in said first to N-th 2-phase sinusoidal wave signals corresponding to an m-th resolution of detection of the displacement of the object where m is a natural number and satisfies a relation of $1 \leq m \leq N$; and a signal processing circuit for processing the first to N-th 2-phase sinusoidal wave signals by product summation or product differentiation of the first to N-th 2-phase sinusoidal wave signals to produce at least one combined signal having a resolution whose reciprocal is equal to a sum of reciprocals of the resolutions of the first to N-th resolutions for detecting information relating to the displacement of the object.

13. A detection apparatus according to claim 6, wherein said signal processing unit produces 2-phase sinusoidal wave signals having a resolution whose reciprocal is equal to a sum of reciprocals of the first to N-the frequencies.

* * * * *